(12) United States Patent
Chen et al.

(10) Patent No.: US 12,706,046 B2
(45) Date of Patent: Aug. 11, 2026

(54) DISPLAY PANEL AND DISPLAY APPARATUS

(71) Applicant: TIANMA ADVANCED DISPLAY TECHNOLOGY INSTITUTE (XIAMEN) CO., LTD., Xiamen (CN)

(72) Inventors: Wang Chen, Xiamen (CN); Yingteng Zhai, Xiamen (CN); Mingyan Xu, Xiamen (CN); Wenxin Jiang, Xiamen (CN); Tianyi Wu, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 19/178,673

(22) Filed: Apr. 14, 2025

(65) Prior Publication Data

US 2026/0162605 A1 Jun. 11, 2026

(30) Foreign Application Priority Data

Jan. 7, 2025 (CN) ........................ 202510024687.0

(51) Int. Cl.
*G09G 3/3233* (2016.01)
*G09G 3/32* (2016.01)
*G11C 19/28* (2006.01)
*G09G 3/20* (2006.01)

(52) U.S. Cl.
CPC ............. *G09G 3/3233* (2013.01); *G09G 3/32* (2013.01); *G11C 19/287* (2013.01); *G09G 3/2074* (2013.01); *G09G 2300/0852* (2013.01); *G09G 2300/0861* (2013.01); *G09G 2310/0286* (2013.01); *G09G 2310/066* (2013.01); *G09G 2310/08* (2013.01); *G09G 2320/0252* (2013.01)

(58) Field of Classification Search
None
See application file for complete search history.

(56) References Cited

U.S. PATENT DOCUMENTS 11,468,825 B2 * 10/2022 Xuan .................. G09G 3/3233
2022/0101783 A1 * 3/2022 Han ......................... G09G 3/32
2023/0306901 A1 * 9/2023 Zhai .................... G09G 3/2011
2025/0037659 A1 * 1/2025 Xu ...................... G09G 3/3233
2025/0174178 A1 * 5/2025 Park .................... G09G 3/3233

* cited by examiner

*Primary Examiner* — Krishna P Neupane
(74) *Attorney, Agent, or Firm* — Tarolli, Sundheim, Covell & Tummino LLP

(57) ABSTRACT

Provided are a display panel and a display apparatus. A shift register in the display panel includes N shift register units connected in cascade. At least one of the shift register units includes a driving module and a gating module. The gating module is configured to receive a signal output by the driving module and a sweep frequency control signal, and output a sweep signal. The sweep frequency control signal and the sweep frequency signal each includes a ramp signal, a period of the sweep frequency control signal is n*H, where H is a scanning time of one row of pixels, and n≥2. In the period of the sweep frequency control signal, a width of the ramp signal in the sweep frequency control signal is (n−1)*H+A, and 0<A<H.

20 Claims, 5 Drawing Sheets

DISPLAY PANEL AND DISPLAY APPARATUS

CROSS-REFERENCE TO RELATED APPLICATION

The present application claims priority to Chinese Patent Application No. 202510024687.0, filed on Jan. 7, 2025, the content of which is incorporated herein by reference in its entirety.

TECHNICAL FIELD

The present disclosure relates to the field of display technologies, and in particular, to a display panel and a display apparatus.

BACKGROUND

Currently, light-emitting diodes (LEDs) are widely used in the display field. For example, Micro-LEDs and Mini-LEDs are often used as display pixels. Micro-LEDs and Mini-LEDs are usually driven by using a pulse amplitude modulation (PAM) circuit and a pulse width modulation (PWM) circuit. The PWM circuit regulates and controls a light-emitting pulse width, and the PAM regulates and controls a light-emitting pulse amplitude. A sweep frequency signal is required to be used in a PWM+PAM circuit. At present, one way to set the sweep frequency signal is to generate it by using a shift register circuit and a gating circuit. When the sweep frequency signal generated in this way is applied, its operating time is shorter. There may be a situation where a light-emitting path cannot be completely turned off within the operating time. Moreover, the short operating time cannot achieve precise grayscale control, which affects the display effect.

SUMMARY

To solve the problems in the related art, the present disclosure provides a display panel and a display apparatus to increase the operating time of the sweep frequency signal and improve the display effect.

In a first aspect, an embodiment of the present disclosure provides a display panel including a shift register, where the shift register includes N shift register units connected in cascade, at least one of the shift register units includes a driving module and a gating module, one control terminal of the gating module is connected to an output terminal of the driving module, and the output terminal of the driving module in an i-th stage shift register unit is connected to an input terminal of the driving module in an (i+1)-th stage shift register unit, where i and N are integers, and $1 \leq i < N$. The gating module is configured to at least receive a signal output by the driving module and a sweep frequency control signal, and output a sweep signal, the sweep frequency control signal and the sweep frequency signal each includes a ramp signal, a period of the sweep frequency control signal is n*H, where H is a scanning time of one row of pixels, n is an integer, and $n \geq 2$. In the period of the sweep frequency control signal, a width of the ramp signal in the sweep frequency control signal is $(n-1)*H+A$, and $0<A<H$.

In a second aspect, based on the same inventive concept, an embodiment of the present disclosure further provides a display apparatus including the display panel provided in any one of the embodiments of the present disclosure.

BRIEF DESCRIPTION OF DRAWINGS

To more clearly illustrate the technical solutions in the embodiments of the present disclosure or in the related art, the drawings required to be used in the description of the embodiments or the related art are briefly introduced below. Apparently, the drawings in the following description are some of the embodiments of the present disclosure. For those skilled in the art, other drawings can also be obtained based on these drawings without any creative efforts.

DESCRIPTION OF EXAMPLES

To make the objectives, technical solutions, and advantages of the embodiments of the present disclosure clearer, the technical solutions in the embodiments of the present disclosure will be clearly and completely described below in conjunction with the drawings in the embodiments of the present disclosure. Apparently, the described embodiments are some rather than all of the embodiments of the present disclosure. Based on the embodiments in the present disclosure, all other embodiments obtained by a person of ordinary skill in the art without creative efforts shall fall within the protection scope of the present disclosure.

The terms used in the embodiments of the present disclosure are only for the purpose of describing specific embodiments and are not intended to limit the present disclosure. The singular forms of "a/an", "the" and "said" used in the embodiments of the present disclosure and the appended claims are also intended to include the plural forms, unless the context clearly indicates otherwise.

Figure 1:
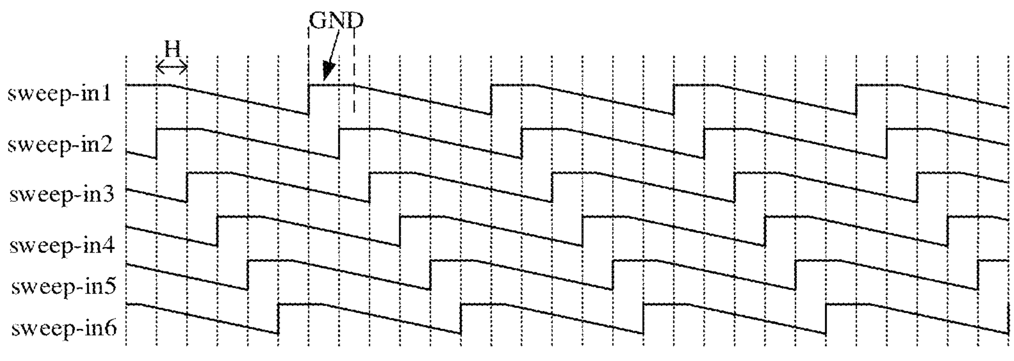
FIG. 1 is a schematic diagram of a period of a sweep frequency control signal in the related art.

In the related art, a sweep frequency signal sweep is generated by a shift register circuit and a gating circuit. A sweep frequency control signal sweep-in is output as a corresponding sweep frequency signal sweep by the gating circuit at a gating moment. FIG. 1 is a schematic diagram of a period of a sweep frequency control signal in the related art. In the embodiment of FIG. 1, the period of the sweep frequency control signal sweep-in is 6H, where H represents a row time, that is, the scanning time corresponding to one row of pixels during display. Six sweep frequency control signals, namely a sweep frequency control signal sweep-in1 to a sweep frequency control signal sweep-in6, are provided in a display panel. As can be seen from the signal waveform, to prevent signal interference between the sweep frequency signals sweep corresponding to rows of pixel circuits, the sweep frequency control signal sweep-in needs to be set to have a GND holding period, and then a duration of a ramp signal in the sweep frequency control signal sweep-in is 4H+A', where A'<H. As a result, an operating time of the generated sweep frequency signal sweep is 4H+A'. However, the operating time of 4H+A' has limited regulation and control over the grayscale of a light-emitting device and cannot achieve precise grayscale regulation and control. Moreover, there may be a situation where a light-emitting path cannot be completely turned off within the operating time.

To solve the problems in the related art, an embodiment of the present disclosure provides a display panel, which uses a shift register unit to generate a sweep frequency signal and sets a width of a ramp signal in a sweep frequency control signal to increase the proportion of the ramp signal in a period. As a result, the waveform of the generated sweep frequency signal can be adjusted, and by cooperating with other signals, an operating time of the sweep frequency signal can be increased.

Figure 2:
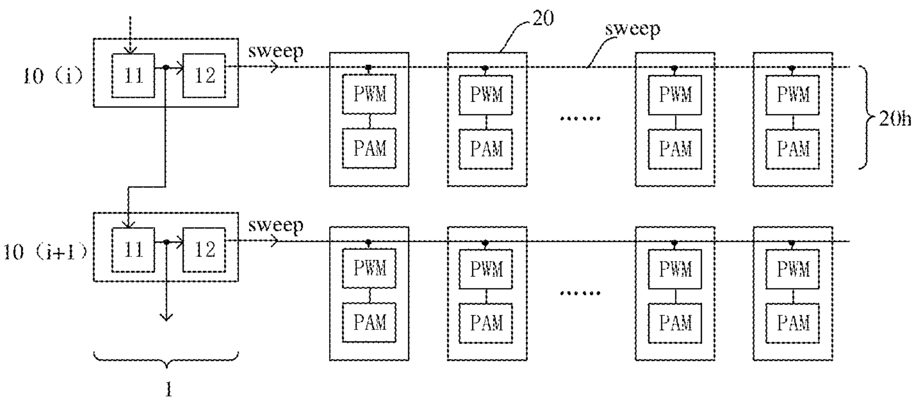
FIG. 2 is a schematic diagram of a display panel provided by an embodiment of the present disclosure.

FIG. 2 is a schematic diagram of a display panel provided by an embodiment of the present disclosure. As shown in FIG. 2, the display panel includes a shift register 1. The shift register 1 includes N shift register units 10 that are cascaded. FIG. 2 illustrates two-stage shift register units 10. At least one of the shift register units 10 includes a driving module 11 and a gating module 12. One control terminal of the gating module 12 is connected to an output terminal of the driving module 11. The output terminal of the driving module 11 in an i-th stage shift register unit 10(*i*) is connected to an input terminal of the driving module 11 in an (i+1)-th stage shift register unit 10 (i+1), where i and N are integers, and 1≤i<N.

The display panel further includes a plurality of pixel circuits 20. The pixel circuits 20 are used to drive sub-pixels. The sub-pixels can be, for example, Micro-LEDs, Mini-LEDs, or organic light-emitting devices. The plurality of pixel circuits 20 are arranged horizontally to form pixel circuit rows 20*h*. For LED devices, they are current-driven devices, and using constant-current driving can ensure their stable operation under different operating conditions and significantly improve the service life of the devices. The brightness of an LED is related to a current flowing through it, and the longer the current flows, the greater the light-emitting brightness. Therefore, the brightness of the LED can be adjusted by adjusting the duration of the current flow. In application, grayscale adjustment can be achieved when the LED is used as a pixel. In the embodiment of the present disclosure, at least one of the pixel circuits includes a first driving circuit PAM and a second driving circuit PWM. The first driving circuit PAM is a pulse amplitude modulation circuit, and the second driving circuit PWM is a pulse width modulation circuit. The first driving circuit PAM is configured to control an amplitude of a driving current provided to a sub-pixel based on a first data voltage, and the second driving circuit PWM is configured to control a duration of a driving current provided to the sub-pixel based on a second data voltage. An output terminal of the gating module 12 is connected to the second driving circuit PWM. A plurality of sweep frequency signal lines sweep (which use the same sign as the sweep signal sweep) are provided in the display panel. One sweep frequency signal line sweep provides a sweep frequency signal sweep for a plurality of second driving circuits PWM in one pixel circuit row 20*h*. As can be seen from FIG. 2, the gating module 12 in the shift register unit 10 is connected to the second driving circuit PWM through the sweep frequency signal line sweep. The sweep frequency signal sweep includes a ramp signal. By cooperating the sweep frequency signal sweep with the second data voltage, the moment when the second driving circuit PWM provides a control signal to the first driving circuit PAM can be controlled, and in turn the turn-off moment of a driving transistor in the first driving circuit PAM can be controlled, which also adjusts the time length of providing the driving current to the sub-pixel. The specific circuit operating process will be described in the following embodiments related to the pixel circuit.

In addition, FIG. 2 shows that the shift register unit 10 is located on one side of the pixel circuit rows 20*h*. In some implementations, the shift register unit 10 is provided between two adjacent pixel circuit rows 20*h*, which is beneficial to narrowing the bezel of the display panel and is not shown in the drawings.

Figure 3A:
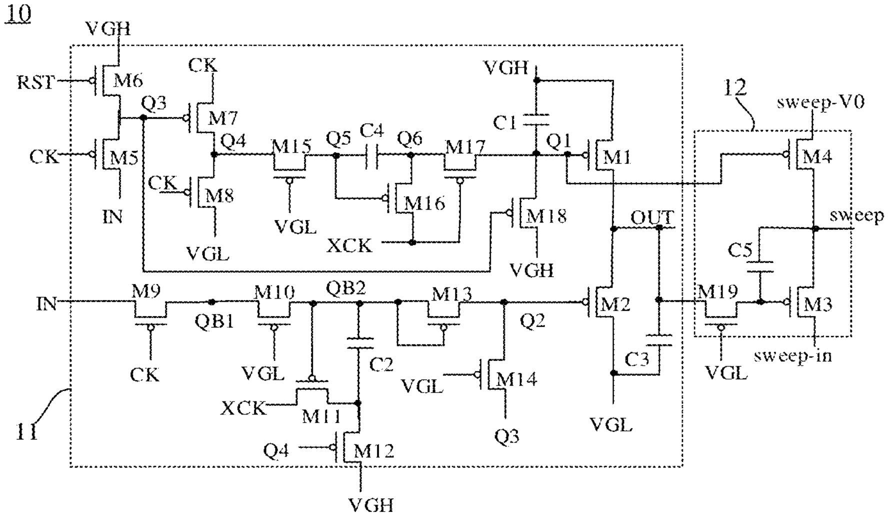
FIG. 3A is a schematic diagram of a shift register unit provided by an embodiment of the present disclosure.

In the embodiments of the present disclosure, the gating module 12 is configured to at least receive a signal output by the driving module 11 and a sweep frequency control signal sweep-in, and output a sweep frequency signal sweep. FIG. 3A is a schematic diagram of a shift register unit provided by an embodiment of the present disclosure. As shown in FIG. 3A, the shift register unit 10 includes a driving module 11 and a gating module 12. The driving module 11 includes an input terminal IN and an output terminal OUT. When the shift register units 10 are cascaded, the input terminal IN of the driving module 11 is connected to the output terminal OUT of the driving module 11 in a previous-stage shift register unit 10. The driving module 11 is any circuit structure capable of realizing signal shifting. The driving module includes a first transistor M1 and a second transistor M2. A control terminal of the first transistor M1 is connected to a first node Q1, and a control terminal of the second transistor M2 is connected to a second node Q2. The first transistor M1 provides a first voltage signal VGH to the output terminal OUT of the driving module 11 under the control of a potential of the first node, and the second transistor M2 provides a second voltage signal VGL to the output terminal OUT of the driving module 11 under the control of a potential of the second node Q2. The gating module 12 includes a third transistor M3 and a fourth transistor M4. A control terminal of the third transistor M3 is connected to the output terminal OUT of the driving module 11, and a control terminal of the fourth transistor M4 is connected to the first node Q1. A first terminal of the third transistor M3 receives the sweep frequency control signal sweep-in, a first terminal of the fourth transistor M4 receives a third voltage signal sweep-V0, and a second terminal of the third transistor M3 and a second terminal of the fourth transistor M4 are connected to the output terminal of the gating module 12.

Optionally, as shown in FIG. 3A, the driving module 11 further includes a fifth transistor M5 to an eighteenth transistor M18. As shown in the figure, M6 is the sixth transistor, M7 is the seventh transistor, and the rest of the transistors are not described one by one. The driving module 11 further includes four capacitors, namely a first capacitor C1, a second capacitor C2, a third capacitor C3, and a fourth capacitor C4. The first node Q1, the second node Q2, nodes Q3 and Q4, as well as nodes Q5, Q6, QB1, and QB2 in the driving module 11 are shown. The operation of the driving module 11 requires a reset signal RST, a first clock signal CK, a second clock signal XCK, the first voltage signal VGH, and the second voltage signal VGL. The gating module 12 further includes a nineteenth transistor M19 and a fifth capacitor C5. A control terminal of the gating module 12 is connected to the driving module 11. For example, the control terminal of the third transistor M3 is connected to the output terminal OUT of the driving module 11 through the nineteenth transistor M19, and the control terminal of the fourth transistor M4 is connected to the first node Q1. For the driving module 11, when the second node Q2 is at a low potential and the first node Q1 is at a high potential, the output terminal OUT of the driving module 11 outputs a low-level signal of the second voltage signal VGL, and when the first node Q1 is at a low potential, the output terminal OUT of the driving module 11 outputs a high-level signal of the first voltage signal VGH.

Figure 3B:
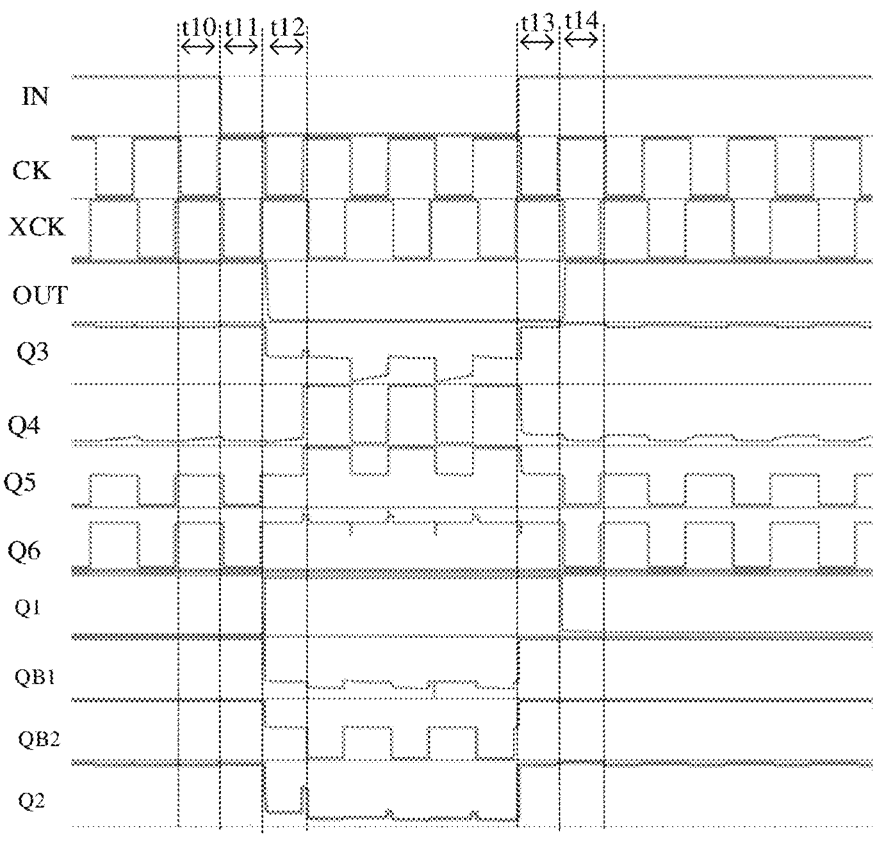
FIG. 3B is a signal timing diagram provided by an embodiment of the present disclosure.

FIG. 3B is a signal timing diagram provided by an embodiment of the present disclosure, which can be applied to the driving of the driving module 11 in FIG. 3A. In conjunction with FIGS. 3 and 4, in a time period t10, the first clock signal CK is at a low level, the second clock signal XCK is at a high level, the input terminal IN is at a high level, the node Q3 is written with a high level, and the node Q4 is written with a low level. In this time period, the first node Q1 is written with a low level, the second node Q2 is written with a high level, and the output terminal OUT of the driving module 11 outputs a high-level signal. In a time period t11, the first clock signal CK is at a high level, the second clock signal XCK is at a low level, the input terminal IN is at a low level, the node Q3 maintains a high level, the node Q4 maintains a low level, the second node Q2 maintains a high potential, the first node Q1 maintains a low potential, and the output terminal OUT of the driving module 11 outputs a high-level signal. In a time period t12, the first clock signal CK is at a low level, the second clock signal XCK is at a high level, the input terminal IN is at a low level, the node Q3 is written with a low level, the node Q4 is written with a low level, the node Q3 controls the eighteenth transistor M18 to turn on, the first node Q1 is written with a high level, and at this time, the second node Q2 is written with a low potential, and the output terminal OUT of the driving module 11 outputs a low-level signal. In a time period t13, the first clock signal CK is at a low level, the second clock signal XCK is at a high level, the input terminal IN is at a high level, the node Q3 is written with a high level, the node Q4 is written with a low level, the first node Q1 is written with a high level, the second node Q2 is written with a high level, and the output terminal OUT of the driving module 11 maintains the output of the low-level signal. In a time period t14, the first clock signal CK is at a high level, the second clock signal XCK is at a low level, the input terminal IN is at a high level, the node Q3 maintains a high level, the node Q4 maintains a low level, the first node Q1 is written with a low level, the second node Q2 is written with a high level, and the output terminal OUT of the driving module 11 outputs a high-level signal. In addition, between the time period t12 and the time period t13, the first node Q1 maintains a high level, the second node Q2 maintains a low level, and the output terminal OUT of the driving module 11 outputs a low-level signal.

Figure 4:
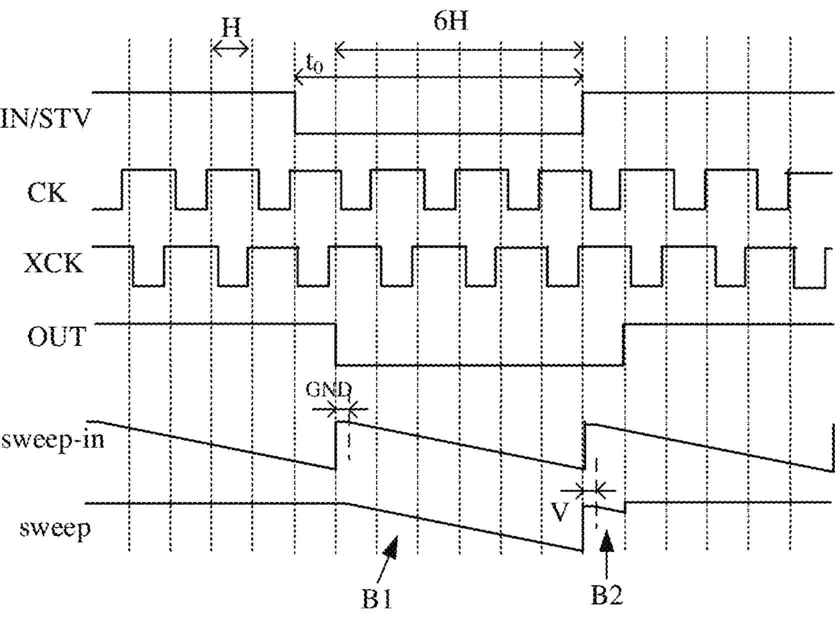
FIG. 4 is another signal timing diagram provided by an embodiment of the present disclosure.

FIG. 4 is a signal timing diagram provided by an embodiment of the present disclosure, which can be applied to the shift register unit 10 provided in FIG. 3A. In conjunction with FIGS. 3A, 3B, and 4, in the time period when the second node Q2 is at a low level and the first node Q1 is at a high potential, the output terminal OUT of the driving module 11 outputs a low-level signal, which controls the third transistor M3 to turn on. The gating module 12 outputs the waveform of the sweep frequency control signal sweep-in as the sweep frequency signal sweep. In the time period when the first node Q1 is at a low potential, the output terminal OUT of the driving module 11 outputs a high-level signal. The low potential of the first node Q1 controls the fourth transistor M4 to turn on, and the gating module 12 outputs a voltage signal provided by the third voltage signal sweep-V0. According to the operating process of the shift register unit 10, the waveform of the sweep frequency control signal sweep-in affects the operating time of the sweep frequency signal sweep.

In the embodiments of the present disclosure, the sweep frequency control signal sweep-in is a periodic signal, the sweep frequency control signal sweep-in and the sweep frequency signal sweep each includes a ramp signal, and the ramp signal refers to a signal whose voltage changes with time. The period of the sweep frequency control signal sweep-in is n*H, where His the scanning time of one row of pixels, n is an integer, and $n \geq 2$. In the period of the sweep frequency control signal sweep-in, a width of the ramp signal in the sweep frequency control signal sweep-in is $(n-1)*H+A$, where $0<A<H$. Taking n=6 as an example in FIG. 4, as can be seen from FIG. 4, the sweep frequency control signal sweep-in includes the ramp signal and a GND holding period. During the GND holding period, the sweep frequency control signal sweep-in is a constant-voltage signal. A sum of the width of the ramp signal and a width of the GND holding period is one period. It can be understood that the width of a signal in the embodiments of the present disclosure refers to the duration of the signal.

In the embodiments of the present disclosure, the width of the ramp signal in the sweep frequency control signal sweep-in is set to be $(n-1)*H+A$, so the width of the GND holding period in the sweep frequency control signal sweep-in is smaller than H, which can maximize the proportion of the ramp signal in the period of the sweep frequency control signal sweep-in and in turn increase the width of the ramp signal of the sweep frequency signal sweep generated by the shift register unit 10, thereby increasing the operating time of the sweep frequency signal sweep, which can ensure that the light-emitting path is completely turned off under the condition that the slope of the sweep frequency signal sweep remains unchanged, make the grayscale regulation and control more precise, and improve the display effect.

In the embodiments of the present disclosure, the driving module 11 has the function of signal shifting. A width of an effective level of the signal output by the output terminal OUT of the driving module 11 is not smaller than a width of an effective level of the signal received by its input terminal IN. The effective level refers to a level that can control a transistor connected to it to turn on. In FIG. 4, the effective level is shown as a low level for illustration. The input terminal of the driving module 11 in a first-stage shift register unit 10 receives a start signal STV, a width of an effective level in the start signal STV is to, and $t_0 \geq (n-1)H+A$. Taking n=6 as an example, the width of the ramp signal in the sweep frequency control signal sweep-in is 5H+A, and the width to of the effective level in the start signal STV is $t_0 \geq 5*H+A$. In the embodiments of the present disclosure, the width of the effective level in the start signal STV it set to be not smaller than the width of the ramp signal in the sweep frequency control signal sweep-in, so the width of the effective level of the signal output by the output terminal OUT of the driving module 11 is not smaller than the width of the ramp signal in the sweep frequency control signal sweep-in. As a result, it is possible to control the complete output of the ramp signal in the sweep frequency control signal sweep-in as the sweep frequency signal sweep by the signal of the output terminal OUT of the driver module 11 when controlling the operation of the gating module 12, thereby increasing the operating time of the sweep frequency signal sweep.

In some embodiments, n is an even number, and the width to of the effective level in the start signal STV is equal to $(n+1)*H$. In conjunction with the timing diagram shown in FIG. 3B, the signal shifting operation of the driving module 11 requires the cooperation of the first clock signal CK and the second clock signal XCK. In the time period t12, the first clock signal CK is at a low level, and the output terminal OUT of the driving module 11 starts to output a low-level signal. In the time period t14, the first clock signal CK is at a high level, and the output terminal OUT of the driving module 11 starts to output a high-level signal, that is, ends the output of the low-level signal. From a start time of the time period t12 to a start time of the time period t14, the first clock signal CK has four low-level pulses and three high-level pulses. One pulse is one row time, which means that the duration of the low-level signal output by the output terminal OUT is an odd number of row times. Therefore, limited by the structure and operating principle of the driving module 11, the effective level signal output by its output terminal OUT can only exist for an odd number of row times. Setting $t_0=(n+1)*H$ can make the width of the effective level of the signal output by the output terminal OUT of the driving module 11 be (n+1)*H. The width of the effective level of the signal output by the output terminal OUT of the driving module 11 is greater than the period of the sweep frequency control signal sweep-in, which can control the complete output of the ramp signal in the sweep frequency control signal sweep-in as the sweep frequency signal sweep by the signal of the output terminal OUT of the driver module 11 when controlling the operation of the gating module 12, thereby increasing the operating time of the sweep frequency signal sweep.

In some implementations, as shown in FIG. 4, the ramp signal in the sweep frequency signal sweep includes a first ramp signal B1 and a second ramp signal B2. A width of the second ramp signal B2 is smaller than a width of the first ramp signal B1. The width of the first ramp signal B1 is (n−1)*H+A. In conjunction with FIGS. 3A and 4, when the output terminal OUT of the driving module 11 outputs a low level (i.e., an effective level), the nineteenth transistor M19 is controlled to turn on, and the ramp signal in the sweep frequency control signal sweep-in is output as the sweep frequency signal sweep. The width of the first ramp signal B1 in the sweep frequency signal sweep is the operating time of the sweep frequency signal sweep. Since the width of the effective level of the signal output by the output terminal OUT of the driving module 11 is greater than the period of the sweep frequency control signal sweep-in, during the time period when the output terminal OUT of the driving module 11 outputs a low level, the gating module 12 not only outputs the waveform of the sweep frequency control signal sweep-in within one period but also outputs the waveform of a part of the sweep frequency control signal sweep-in in the next period. As a result, the ramp signal in the sweep frequency signal sweep includes the first ramp signal B1 and the second ramp signal B2. The second ramp signal B2 is equivalent to a small trailing phenomenon of the sweep frequency signal sweep.

In the embodiments of the present disclosure, the width of the second ramp signal B2 is smaller than H. In conjunction with FIG. 4, affected by the waveform of the sweep frequency control signal sweep-in, during the time period when the output terminal OUT of the driving module 11 outputs a low level, the sweep frequency signal sweep includes not only the first ramp signal B1 and the second ramp signal B2 but also a constant-voltage signal. For example, there is a constant-voltage signal V between the first ramp signal B1 and the second ramp signal B2, and a width of the constant-voltage signal Vis basically equal to the width of the GND holding period. By setting the width of the second ramp signal B2 to be smaller than H and a sum of the width of the constant-voltage signal V and the width of the second ramp signal B2 to be equal to H, it can be ensured that the width of the first ramp signal B1 is large enough, so that the sweep frequency signal sweep has a relatively long operating time.

Figure 5:
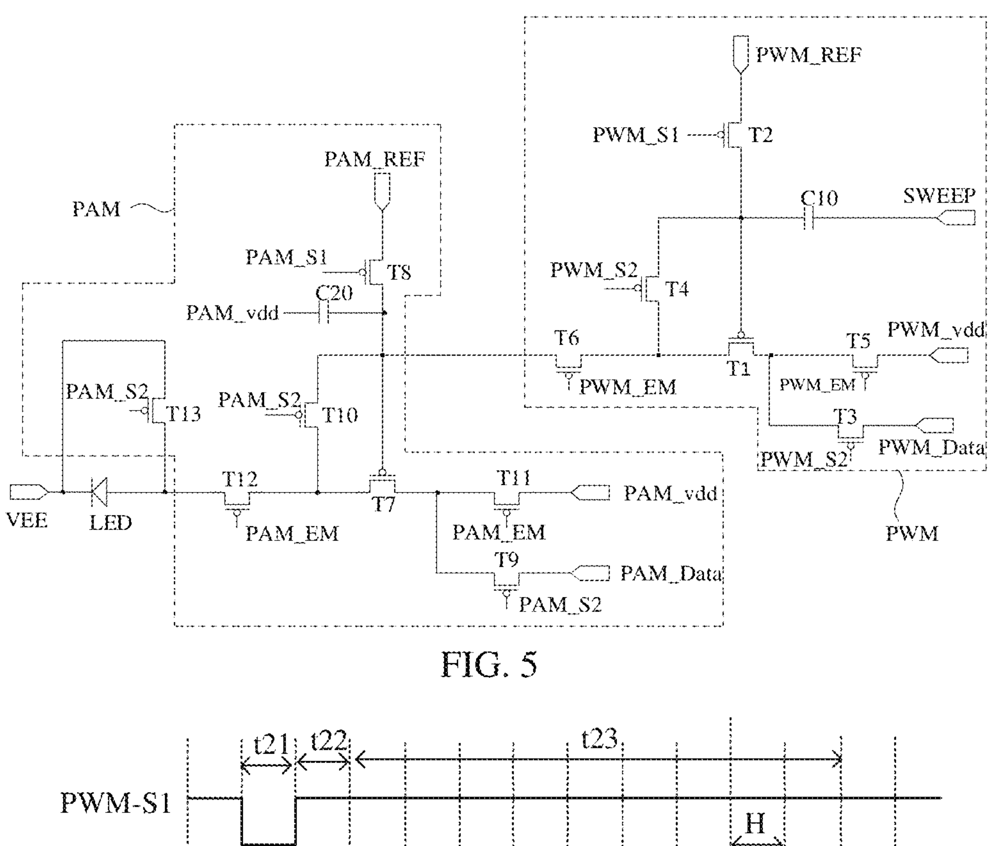
FIG. 5 is a schematic diagram of a pixel circuit provided by an embodiment of the present disclosure.

In some implementations, FIG. 5 is a schematic diagram of a pixel circuit provided by an embodiment of the present disclosure. As shown in FIG. 5, the pixel circuit includes a first driving circuit PAM and a second driving circuit PWM. The first driving circuit PAM is configured to control an amplitude of a driving current provided to a sub-pixel based on a first data voltage PAM-Data, and the second driving circuit PWM is configured to control a duration of the driving current provided to the sub-pixel based on a second data voltage PWM-Data. FIG. 5 illustrates the sub-pixel including a light-emitting device LED.

The first driving circuit PAM includes a first driving transistor T7, a first gate reset transistor T8, a first data writing transistor T9, a first compensation transistor T10, a first control transistor T11, a second control transistor T12, an electrode reset transistor T13, and a first storage capacitor C20. The first storage capacitor C20 is a storage capacitor in the first driving circuit PAM. The first driving transistor T7 is connected in series between the first control transistor T11 and the second control transistor T12. The first control transistor T11 is connected between a first power supply voltage PAM-vdd and a first terminal of the first driving transistor T7, and the second control transistor T12 is connected between a second terminal of the first driving transistor T7 and the light-emitting device LED. The first driving transistor T7 is configured to generate a driving current under the control of a voltage of its gate. The first data writing transistor T9 is connected to the first terminal of the first driving transistor T7, the first compensation transistor T10 is connected to the second terminal and a control terminal of the first driving transistor T7, and the first gate reset transistor T8 is connected to the control terminal (i.e., the gate) of the first driving transistor T7. A first plate of the first storage capacitor C20 is connected to the gate of the first driving transistor T7, and a second plate of the first storage capacitor C20 is connected to the first power supply voltage PAM-vdd. The electrode reset transistor T13 is connected to a first electrode of the light-emitting device LED, and the second control transistor T12 is also connected to the first electrode of the light-emitting device LED. A second electrode of the light-emitting device LED is connected to a third power supply voltage VEE. A gate of the first gate reset transistor T8 is connected to a first scanning signal PAM-S1. A gate of the first data writing transistor T9, a gate of the first compensation transistor T10, and a gate of the electrode reset transistor T13 are connected to a second scanning signal PAM-S2. A control terminal of the first control transistor T11 and/or a control terminal of the second control transistor T12 receive a first control signal PAM-EM. In addition, FIG. 5 illustrates that the electrode reset transistor T13 has a first terminal receiving the third power supply voltage VEE and a second terminal connected to the first electrode of the light-emitting device LED. In other implementations, the first terminal of the electrode reset transistor T13 may receive a reset signal PAM-REF or a constant-voltage signal PAM-INIT.

The second driving circuit PWM includes a second driving transistor T1, a second gate reset transistor T2, a second data writing transistor T3, a second compensation transistor T4, a third control transistor T5, a fourth control transistor T6, and a second storage capacitor C10. The third control transistor T5 is connected between a second power supply voltage PWM-vdd and a first terminal of the second driving transistor T1, and the fourth control transistor T6 is connected between a second terminal of the second driving transistor T1 and the gate of the first driving transistor T7. The second data writing transistor T3 is connected to the first terminal of the second driving transistor T1, the second compensation transistor T4 is connected to the second terminal and a gate of the second driving transistor T1, and the second gate reset transistor T2 is connected to the gate of the second driving transistor T1. A gate of the second gate reset transistor T2 is connected to a third scanning signal PWM-S1, a gate of the second data writing transistor T3 and a gate of the second compensation transistor T4 are connected to a fourth scanning signal PWM-S2. A gate of the third control transistor T5 and a gate of the fourth control transistor T6 are connected to a second control signal PWM-EM.

FIG. 5 illustrates that an output terminal of the second driving circuit PWM (i.e., an output terminal of the fourth control transistor T6) is connected to the gate of the first driving transistor T7. In another implementation, an output terminal of the second driving circuit PWM is connected to a gate of the second control transistor T12, which is not illustrated in the drawings here. In some other embodiments, a light-emitting duration control transistor is additionally provided on a light-emitting series circuit of the first driving circuit PAM. For example, a light-emitting duration control transistor is connected in series between the second control transistor T12 and the light-emitting device LED in FIG. 5, and the output terminal of the second driving circuit PWM is connected to a gate of the light-emitting duration control transistor.

Figure 6:
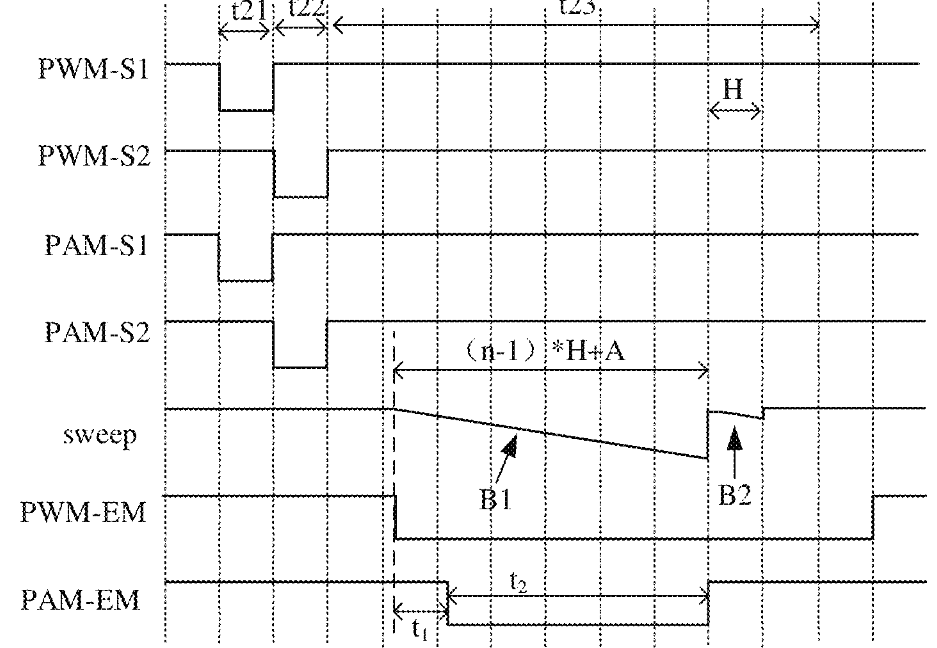
FIG. 6 is a timing diagram of a pixel circuit provided by an embodiment of the present disclosure.

FIG. 6 is a timing diagram of a pixel circuit provided by an embodiment of the present disclosure. Referring to FIG. 6, for the first driving circuit PAM, in a reset stage t21, in the time period when the first scanning signal PAM-S1 provides a low level, the first gate reset transistor T8 is controlled to turn on, and the gate of the first driving transistor T7 is reset using the reset signal PAM-REF; in a writing stage t22, the second scanning signal PAM-S2 provides a low level to control the first data writing transistor T9 and the first compensation transistor T10 to turn on, and the first data voltage PAM-Data is written to the gate of the first driving transistor T7; in a light-emitting stage t23, the first control signal PAM-EM provides a low level to control the first control transistor T11 and the second control transistor T12 to turn on, and the first driving transistor T7 generates a driving current and provides the driving current to the light-emitting device LED.

For the second driving circuit PWM, in the reset stage t21, the third scanning signal PWM-S1 provides a low level to control the second gate reset transistor T2 to turn on, and the gate of the second driving transistor T1 is reset using the reset signal PWM-REF; in the writing stage t22, the fourth scanning signal PWM-S2 provides a low level to control the second data writing transistor T3 and the second compensation transistor T4 to turn on, and the second data voltage PWM-Data is written to the gate of the second driving transistor T1; in the light-emitting stage t23, the second control signal PWM-EM provides a low level to control the third control transistor T5 and the fourth control transistor T6 to turn on. As the voltage of the sweep frequency signal sweep gradually changes, due to the coupling effect of the second storage capacitor C10, the gate voltage of the second driving transistor T1 gradually changes. When the gate voltage of the second driving transistor T1 changes to enable the second driving transistor T1 to reach an on-state, the current generated by the second driving transistor T1 will cause the change of the gate voltage of the first driving transistor T7 until the first driving transistor T7 is turned off. As a result, the first driving circuit PAM stops providing the driving current to the light-emitting device LED, that is, the duration of providing the driving current is controlled through the second driving circuit PWM.

As shown in FIG. 6, during operation of the pixel circuit, a time period of an effective level in the first control signal PAM-EM does not overlap with the second ramp signal B2 in the sweep frequency signal sweep. That is, during the time period of the second ramp signal B2 in the sweep frequency signal sweep, the first control signal PAM-EM is at a non-effective level. In this time period, the first control transistor T11 and the second control transistor T12 are in an off-state. Therefore, the second ramp signal B2 in the sweep frequency signal sweep will not cause the first driving circuit PAM to provide a driving current, and thus will not affect the duration of the driving current provided by the pixel circuit.

In some implementations, as shown in FIG. 6, the first ramp signal B1 in the sweep frequency signal sweep appears earlier than the second ramp signal B2. During operation of the pixel circuit, an end time of the effective level in the first control signal PAM-EM is not later than a start time of the second ramp signal B2. As such, the effective level period of the first control signal PAM-EM does not overlap with the second ramp signal B2 in the sweep frequency signal sweep, and the effective level period of the first control signal PAM-EM overlaps with the first ramp signal B1, ensuring the reasonable and full utilization of the operating duration of the first ramp signal B1 in the sweep frequency signal sweep.

As shown in FIG. 6, during operation of the pixel circuit, a start time of the first ramp signal B1 is earlier than a start time of the effective level in the first control signal PAM-EM, that is, earlier than a falling edge of the first control signal PAM-EM. Such a setting can ensure that the sub-pixel have a dark state of non-light-emission, meeting the gray-scale setting requirements of the sub-pixel. Based on the operating principle of the pixel circuit, it can be known that the duration of the light-emitting current is controlled by the second data voltage PWM-Data, that is, the actual light-emitting duration is controlled. The maximum value in the preset value range of the second data voltage PWM-Data controls the maximum light-emitting time of the light-emitting device LED, and the minimum value controls the minimum light-emitting time of the light-emitting device LED, that is, the light-emitting device LED is made not emit light. To ensure that the light-emitting device LED can have a non-light-emitting state, it is required that when the minimum value of the second data voltage PWM-Data is written into the second driving circuit PWM, the sweep frequency signal sweep changes to enable the second driving transistor T1 in the second driving circuit PWM to reach the on-state within a certain period. When the second driving transistor T1 is already in the on-state, the gate voltage of the first driving transistor T7 in the first driving circuit PAM has been pulled high, making the driving transistor turn off. Even if the first control signal PAM-EM is at an effective level, no driving current will be generated, thus making the light-emitting device LED in a dark state.

As shown in FIG. 6, during operation of the pixel circuit, a duration between the start time of the first ramp signal B1 and the start time of the effective level in the first control signal PAM-EM is $t_1$, and a duration between the start time of the effective level in the first control signal PAM-EM and an end time of the first ramp signal B1 is $t_2$, where $t_1<t_2$. Such a setting not only ensures that the sub-pixel has a dark state of non-emission, but also can make the duration available for regulating and controlling the grayscale display of the sub-pixel long enough to achieve more precise grayscale regulation and control.

In some implementations, $t_1 \geq H$. That is, the minimum value of $t_1$ is one row time H. The setting of $t_1$ needs to consider the settable value of the slope of the sweep frequency signal sweep and the minimum value of the second data voltage PWM-Data. By coordinating the slope of the sweep frequency signal sweep with $t_1$, the second driving transistor T1 in the second driving circuit PWM can reach the on state within the time period $t_1$.

In some implementations, $H < t_2 \leq (n-2)*H+A$. Such a setting makes the overlapping time between the effective level in the first control signal PAM-EM and the first ramp signal B1 long enough, enabling the full utilization of the operating time of the first ramp signal B1, ensuring the complete turn-off of the light-emitting path, and making the grayscale regulation and control more precise, thus improving the display effect.

In some implementations, the time period of the effective level in the first control signal PAM-EM can partially overlap with the constant-voltage signal period between the first ramp signal B1 and the second ramp signal B2. A width of the effective level in the first control signal PAM-EM is $(n-1)*H$. For example, when n=6, the width of the first ramp signal B1 is 5*H+A, and the width of the effective level in the first control signal PAM-EM is 5*H. The width of the effective level in the first control signal PAM-EM can cooperate with the width of the first ramp signal B1 to ensure the reasonable and full utilization of the operating time of the first ramp signal B1, making the grayscale regulation and control more precise.

Figure 7:
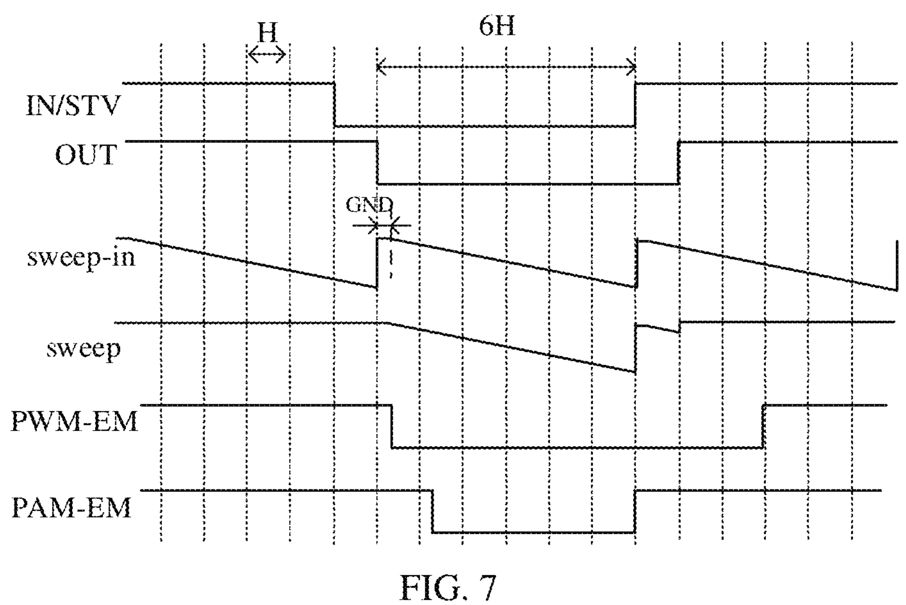
FIG. 7 is another signal timing diagram provided by an embodiment of the present disclosure.

In some implementations, FIG. 7 is another signal timing diagram provided by an embodiment of the disclosure. FIG. 7 illustrates the timing of several control signals required to be used by the display panel. The input terminal IN of the driving module 11 in a first-stage shift register unit 10 receives a start signal STV, and the width of the effective level of the signal output by the output terminal OUT of the driving module 11 is affected by the signal at its input terminal IN. From the relevant description of the above-mentioned embodiments, it can be known that the effective level output by the output terminal OUT of the driving module 11 controls the gating module 12 to output the sweep frequency control signal sweep-in as the sweep frequency signal sweep. As can be seen from FIG. 7, in the embodiments of the disclosure, a width of an effective level in the start signal STV is set to be greater than a width of the effective level in the first control signal PAM-EM. As a result, the width of the first ramp signal B1 in the sweep frequency signal sweep can be matched with the width of the effective level in the first control signal PAM-EM, increasing the operating time of the sweep frequency signal sweep.

In some implementations, as shown in FIG. 5, the control terminal of the third control transistor T5 and/or the control terminal of the fourth control transistor T6 in the second driving circuit PWM receives the second control signal PWM-EM. In conjunction with the timing diagram in FIG. 6, it can be seen that during operation of the pixel circuit, a width of an effective level in the second control signal PWM-EM is greater than the width of the effective level in the first control signal PAM-EM. Such a setting enables the second driving transistor T1 to be turned on through the sweep frequency signal sweep at any time point when the first control signal PAM-EM provides an effective level, and in turn controls the change of the gate voltage of the first driving transistor T7 in the first driving circuit PAM, realizing the control of the duration of providing the driving current.

As shown in FIG. 6, during operation of the pixel circuit, the start time of the effective level in the second control signal PWM-EM is earlier than the start time of the effective level in the first control signal PAM-EM. Such a setting can realize the cooperation between the second control signal PWM-EM and the first ramp signal B1. When the minimum value of the second data voltage PWM-Data is written into the second driving circuit PWM, the sweep frequency signal sweep changes to a state where the second driving transistor T1 can be turned on within a certain time period, and in turn the gate voltage of the first driving transistor T7 in the first driving circuit PAM is pulled high, making the driving transistor in an off state. Even if the first control signal PAM-EM is at an effective level later, no driving current will be generated, making the light-emitting device LED in a dark state.

As shown in FIG. 6, during operation of the pixel circuit, the end time of the effective level in the second control signal PWM-EM is later than the end time of the effective level in the first control signal PAM-EM. Such a setting enables the second driving transistor T1 to be turned on through the sweep frequency signal sweep at any time point when the first control signal PAM-EM provides an effective level, and in turn controls the change of the gate voltage of the first driving transistor T7 in the first driving circuit PAM, realizing the control of the duration of providing the driving current.

In some implementations, as shown in FIG. 6, during operation of the pixel circuit, the width of the effective level in the second control signal PWM-EM is greater than a sum of the width of the first ramp signal B1 and the width of the second ramp signal B2 in the sweep frequency signal sweep. The width of the effective level in the second control signal PWM-EM is set to be large enough to ensure that it can cooperate with the operating duration of the sweep frequency signal sweep, fully and reasonably utilizing the operating time of the sweep frequency signal sweep.

Figure 8:
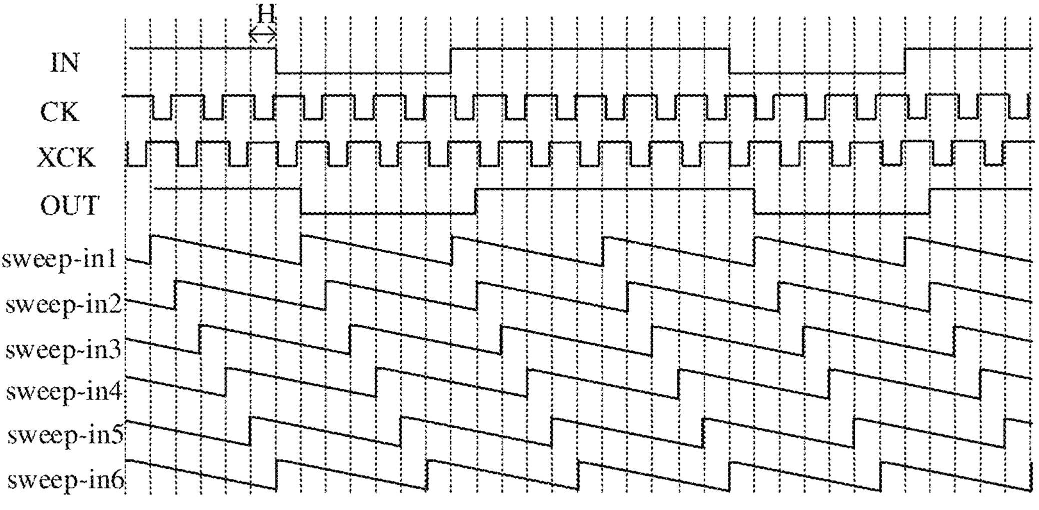
FIG. 8 is another signal timing diagram provided by an embodiment of the present disclosure.

In some implementations, FIG. 8 is another signal timing diagram provided by an embodiment of the disclosure. In the embodiments of the disclosure, the period of the sweep frequency control signal sweep-in is n*H. The display panel includes n sweep frequency control signal lines. That is, the number of sweep frequency control signal lines is the same as the number of periods of the sweep frequency control signal sweep-in. The sweep frequency control signal line sweep-in provides the sweep frequency control signal sweep-in, and the sweep frequency control signal line sweep-in and the sweep frequency control signal sweep-in it provides use the same sign. The n sweep frequency control signal lines sweep-in include a first sweep frequency control signal line sweep-in1, a second sweep frequency control signal line sweep-in2, to a nth sweep frequency control signal line sweep-inn arranged in sequence. Period start times of the sweep frequency control signals sweep-in provided by two adjacent sweep frequency control signal lines sweep-in in the sequence differ by H. FIG. 8 illustrates an example with n=6.

In the embodiments of the disclosure, the gating module 12 in a j-th stage shift register unit 10 and the gating module 12 in a (n*m+j)-th stage shift register unit 10 are connected to a j-th sweep frequency control signal line sweep-in, where j and m are integers, $1 \leq j \leq n$, and $1 < m \leq (N/n)-1$. For example, when n=6, the gating module 12 in the first-stage shift register unit 10 and the gating module 12 in the seventh-stage shift register unit 10 are connected to the first sweep frequency control signal line sweep-in1. In the embodiments of the disclosure, by setting n sweep frequency control signal lines sweep-in in the display panel and setting the number of stages of the shift register units 10 connected to the sweep frequency control signal lines sweep-in, multiple sweep frequency control signals sweep-in can be sequentially output through multiple-stage shift register units 10 to realize the row-by-row driving of multiple pixel circuit rows.

Figure 9:
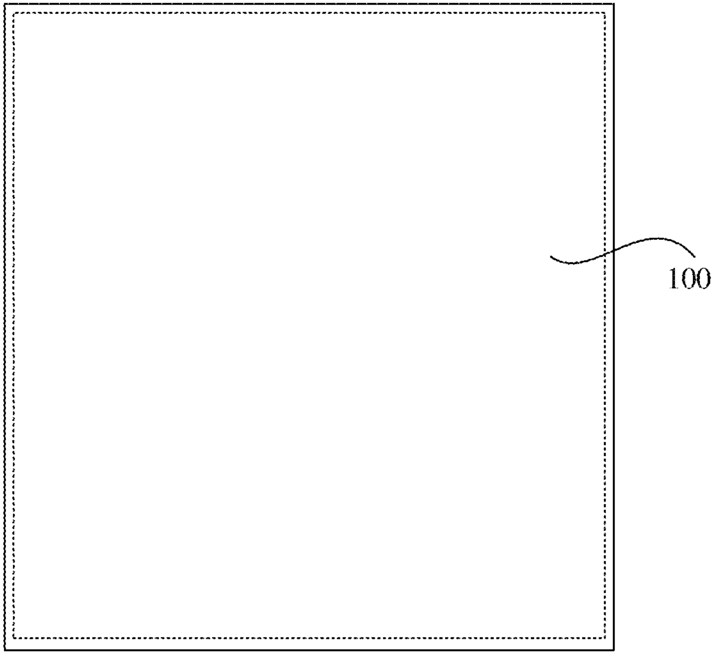
FIG. 9 is a schematic diagram of a display apparatus provided by an embodiment of the present disclosure.

Based on the same inventive concept, an embodiment of the disclosure provides a display apparatus. FIG. 9 is a schematic diagram of the display apparatus provided by the embodiment of the disclosure. As shown in FIG. 9, the display apparatus includes the display panel 100 provided by any one of the embodiments of the disclosure. The structure of the display panel has been described in the above-mentioned embodiments, which will not be repeated here. The display apparatus provided by the embodiments of the disclosure can be, for example, a mobile phone, a tablet, a television, a smart billboard, or a spliced display apparatus, etc.

The above are only preferred embodiments of the disclosure and are not intended to limit the disclosure. Any modifications, equivalent substitutions, improvements, etc. made within the spirit and principle of the disclosure shall be included in the protection scope of the disclosure.

Finally, it should be noted that the above embodiments are only used to illustrate the technical solutions of the disclosure, not to limit them. Although the disclosure has been described in detail with reference to the foregoing embodiments, those skilled in the art should understand that they can still modify the technical solutions recited in the foregoing embodiments, or make equivalent substitutions for some or all of the technical features in the technical solutions. However, these modifications or substitutions do not make the essence of the corresponding technical solutions deviate from the scope of the technical solutions of the embodiments of the disclosure.

What is claimed is:

1. A display panel, comprising a shift register, wherein the shift register comprises N shift register units connected in cascade, at least one of the shift register units comprises a driving module and a gating module, and one control terminal of the gating module is connected to an output terminal of the driving module, and the output terminal of the driving module in an i-th stage shift register unit is connected to an input terminal of the driving module in an (i+1)-th stage shift register unit, wherein i and N are integers, and $1 \leq i < N$;

the gating module is configured to at least receive a signal output by the driving module and a sweep frequency control signal, and output a sweep frequency signal, the sweep frequency control signal and the sweep frequency signal each comprises a ramp signal, and a period of the sweep frequency control signal is n*H, wherein His a scanning time of one row of pixels, n is an integer, and $n \geq 2$; and wherein in the period of the sweep frequency control signal, a width of the ramp signal in the sweep frequency control signal is (n−1)*H+A, and $0 < A < H$.

2. The display panel according to claim 1, wherein the input terminal of the driving module in a first-stage shift register unit receives a start signal, and a width of an effective level in the start signal is to, and $t_0 \geq (n-1)*H+A$.

3. The display panel according to claim 2, wherein n is an even number, and $t_0 = (n+1)*H$.

4. The display panel according to claim 1, wherein the ramp signal in the sweep frequency signal comprises a first ramp signal and a second ramp signal, a width of the first ramp signal is (n−1)*H+A, and a width of the second ramp signal is smaller than the width of the first ramp signal.

5. The display panel according to claim 4, wherein the width of the second ramp signal is smaller than H.

6. The display panel according to claim 4, further comprising a pixel circuit, wherein the pixel circuit comprises a first driving circuit and a second driving circuit, the first driving circuit is configured to control an amplitude of a driving current provided to a sub-pixel based on a first data voltage, and the second driving circuit is configured to control a duration of the driving current provided to the sub-pixel based on a second data voltage;

an output terminal of the gating module is connected to the second driving circuit;

the first driving circuit comprises a first driving transistor, a first control transistor, and a second control transistor, the first driving transistor is connected in series between the first control transistor and the second control transistor, and a control terminal of the first control transistor and/or a control terminal of the second control transistor receives a first control signal; and during operation of the pixel circuit, a time period of an effective level in the first control signal does not overlap with the second ramp signal.

7. The display panel according to claim 6, wherein during operation of the pixel circuit, an end time of the effective level in the first control signal is not later than a start time of the second ramp signal.

8. The display panel according to claim 6, wherein during operation of the pixel circuit, a start time of the first ramp signal is earlier than a start time of the effective level in the first control signal.

9. The display panel according to claim 8, wherein during operation of the pixel circuit, a duration between the start time of the first ramp signal and the start time of the effective level in the first control signal is $t_1$, and a duration between the start time of the effective level in the first control signal and an end time of the first ramp signal is $t_2$, wherein $t_1 < t_2$.

10. The display panel according to claim 9, wherein $t_1 \geq H$.

11. The display panel according to claim 9, wherein $H < t_2 \leq (n-2)*H+A$.

12. The display panel according to claim 6, wherein a width of the effective level in the first control signal is (n−1)*H.

13. The display panel according to claim 6, wherein the input terminal of the driving module in a first-stage shift register unit receives a start signal; and a width of an effective level in the start signal is greater than a width of the effective level in the first control signal.

14. The display panel according to claim 6, wherein the second driving circuit comprises a second driving transistor, a third control transistor, and a fourth control transistor, the second driving transistor is connected in series between the third control transistor and the fourth control transistor, and a control terminal of the third control transistor and/or a control terminal of the fourth control transistor receives a second control signal;

during operation of the pixel circuit, a width of an effective level in the second control signal is greater than a width of the effective level in the first control signal.

15. The display panel according to claim 14, wherein during operation of the pixel circuit, a start time of the effective level in the second control signal is earlier than a start time of the effective level in the first control signal.

16. The display panel according to claim 6, wherein during operation of the pixel circuit, an end time of the effective level in the second control signal is later than an end time of the effective level in the first control signal.

17. The display panel according to claim 6, wherein the second driving circuit comprises a second driving transistor, a third control transistor, and a fourth control transistor, the second driving transistor is connected in series between the third control transistor and the fourth control transistor, and a control terminal of the third control transistor and/or a control terminal of the fourth control transistor receives a second control signal; and during operation of the pixel circuit, a width of an effective level in the second control signal is greater than a sum of the width of the first ramp signal and the width of the second ramp signal in the sweep frequency signal.

18. The display panel according to claim 1, further comprising n sweep frequency control signal lines, wherein at least one of the sweep frequency control signal lines provides the sweep frequency control signal, the n sweep frequency control signal lines comprise a first sweep frequency control signal line, a second sweep frequency control signal line, to a n-th sweep frequency control signal line arranged in sequence; and period start times of sweep frequency control signals provided by two adjacent sweep frequency control signal lines in the sequence differ by H; and wherein the gating module in a j-th stage shift register unit and the gating module in a (n*m+j)-th stage shift register unit are connected to a j-th sweep frequency control signal line, wherein j and m are integers, $1 \leq j \leq n$, and $1 \leq m \leq (N/n)-1$.

19. The display panel according to claim 1, wherein the driving module comprises a first transistor and a second transistor, a control terminal of the first transistor is connected to a first node, and a control terminal of the second transistor is connected to a second node, the first transistor provides a first voltage signal to the output terminal of the driving module under the control of a potential of the first node, and the second transistor provides a second voltage signal to the output terminal of the driving module under the control of a potential of the second node; and the gating module comprises a third transistor and a fourth transistor, a control terminal of the third transistor is connected to the output terminal of the driving module, and a control terminal of the fourth transistor is connected to the first node, a first terminal of the third transistor receives the sweep frequency control signal, a first terminal of the fourth transistor receives a third voltage signal, and a second terminal of the third transistor and a second terminal of the fourth transistor are connected to the output terminal of the gating module.

20. A display apparatus, comprising a display panel;

wherein the display panel comprises a shift register, wherein the shift register comprises N shift register units connected in cascade, at least one of the shift register units comprises a driving module and a gating module, and one control terminal of the gating module is connected to an output terminal of the driving module, and the output terminal of the driving module in an i-th stage shift register unit is connected to an input terminal of the driving module in an (i+1)-th stage shift register unit, wherein i and N are integers, and $1 \leq i < N$;

the gating module is configured to at least receive a signal output by the driving module and a sweep frequency control signal, and output a sweep frequency signal, the sweep frequency control signal and the sweep frequency signal each comprises a ramp signal, and a period of the sweep frequency control signal is n*H, wherein H is a scanning time of one row of pixels, n is an integer, and $n \geq 2$; and wherein in the period of the sweep frequency control signal, a width of the ramp signal in the sweep frequency control signal is (n−1)*H+A, and $0 < A < H$.

* * * * *